United States Patent
Kredler et al.

(10) Patent No.: US 8,125,070 B2
(45) Date of Patent: Feb. 28, 2012

(54) SEMICONDUCTOR COMPONENT

(75) Inventors: Stefan Kredler, Heuweiler (DE); Reiner Bidenbach, Vörstetten (DE); Jens Schubert, Freiburg (DE); Klaus Heberle, Emmendingen (DE)

(73) Assignee: Micronas GmbH, Freiburg I.BR. (DE)

( * ) Notice: Subject to any disclaimer, the term of this patent is extended or adjusted under 35 U.S.C. 154(b) by 0 days.

(21) Appl. No.: 12/336,862

(22) Filed: Dec. 17, 2008

(65) Prior Publication Data

US 2009/0152548 A1 Jun. 18, 2009

(30) Foreign Application Priority Data

Dec. 18, 2007 (EP) .................................. 07024487

(51) Int. Cl.
*H01L 23/02* (2006.01)

(52) U.S. Cl. ......... 257/690; 257/691; 257/784; 257/786

(58) Field of Classification Search .................. 257/678, 257/690, 784, 787, E23.116
See application file for complete search history.

(56) References Cited

U.S. PATENT DOCUMENTS

| | | | |
|---|---|---|---|
| 4,833,341 A | 5/1989 | Watanabe et al. | |
| 5,023,476 A | 6/1991 | Watanabe et al. | |
| 6,917,011 B2 | 7/2005 | Hong et al. | |
| 7,125,729 B2 | 10/2006 | Burger et al. | |
| 7,245,008 B2 * | 7/2007 | Lee .............................. | 257/686 |
| 7,259,028 B2 | 8/2007 | Takiar et al. | |
| 7,385,299 B2 | 6/2008 | Chow et al. | |
| 2003/0010761 A1 | 1/2003 | Hong et al. | |
| 2004/0178499 A1 * | 9/2004 | Mistry et al. .................. | 257/734 |
| 2005/0005748 A1 | 1/2005 | Burger et al. | |
| 2007/0152215 A1 | 7/2007 | Takiar et al. | |
| 2007/0200257 A1 * | 8/2007 | Chow et al. .................... | 257/787 |
| 2007/0257352 A1 | 11/2007 | Takiar et al. | |
| 2008/0157236 A1 * | 7/2008 | Chen et al. ..................... | 257/415 |
| 2008/0315436 A1 * | 12/2008 | Mueller et al. ................ | 257/778 |

FOREIGN PATENT DOCUMENTS

| | | |
|---|---|---|
| DE | 3710865 A1 | 10/1987 |
| EP | 1276142 A2 | 1/2003 |
| JP | 03094438 | 4/1991 |
| JP | 2738568 B2 | 1/1998 |
| JP | 2003347482 | 5/2003 |
| WO | 03039217 A1 | 5/2003 |

* cited by examiner

*Primary Examiner* — Cuong Q Nguyen
*Assistant Examiner* — Tran Tran
(74) *Attorney, Agent, or Firm* — Muncy, Geissler, Olds & Lowe, PLLC

(57) ABSTRACT

A semiconductor component has at least one semiconductor chip in which an electrical circuit is integrated. The semiconductor chip is surrounded by an electrically insulating encapsulating compound and has on its surface at least one termination surface for a test signal, which is covered by the encapsulating compound. The termination surface is connected in an electrically conductive manner to an analysis contact that projects above the surface of the semiconductor chip, that is located in the interior of the encapsulating compound at a distance from its exterior surface, and that can be exposed by removing a layer of the encapsulating compound located near the exterior.

10 Claims, 9 Drawing Sheets

SEMICONDUCTOR COMPONENT

Figure 1:
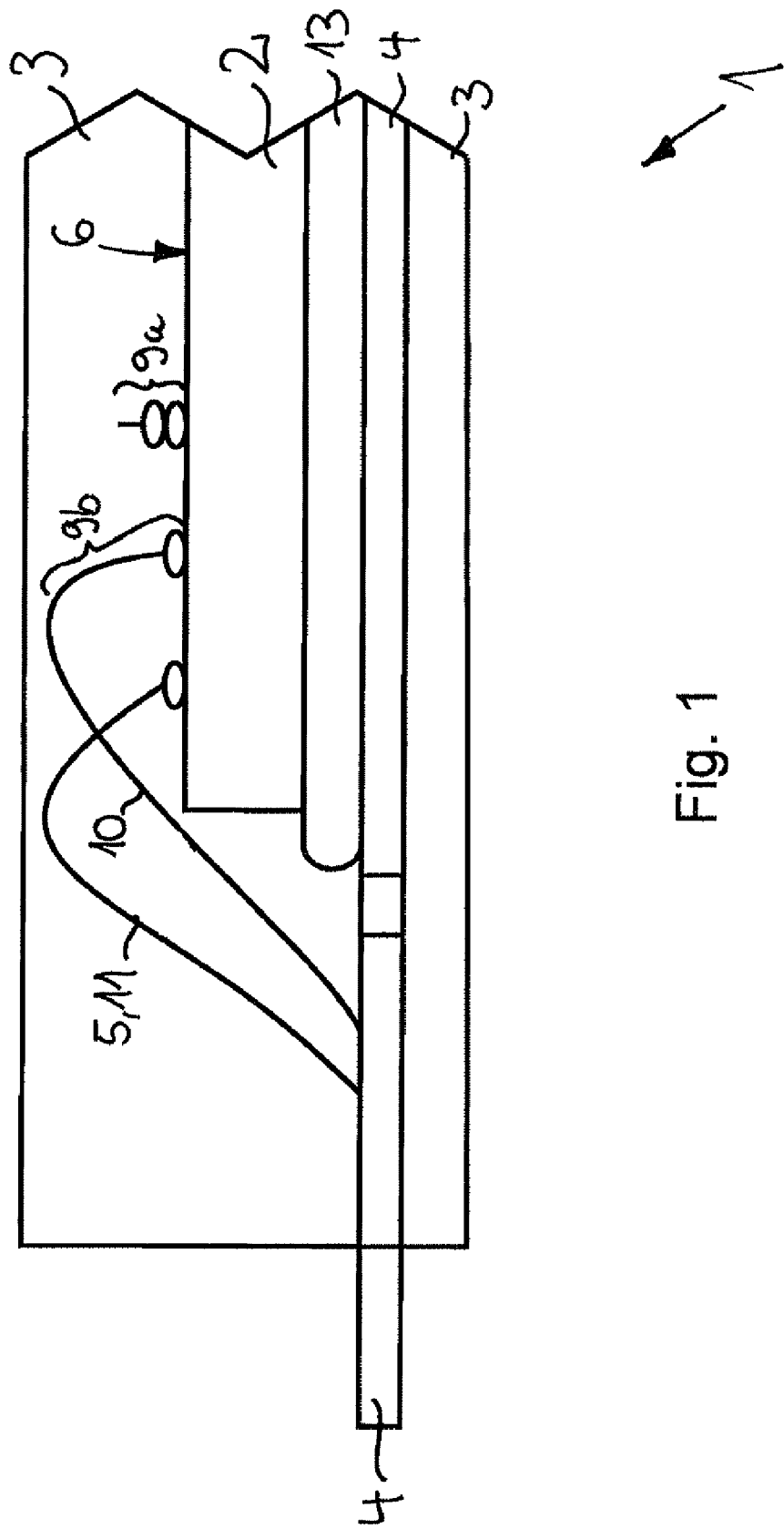

The invention relates to a semiconductor component having at least one semiconductor chip in which an electrical circuit is integrated, wherein the semiconductor chip has at least one termination surface for a test signal, and wherein the semiconductor chip is surrounded by an electrically insulating encapsulating compound that covers the termination surface.

A semiconductor component of this type is known in actual practice. It has a plurality of connection contacts that are surrounded by the encapsulating compound, that are accessible from the exterior, and that are connected to the electrical connecting points of the semiconductor chip by means of bond wires that are embedded in the encapsulating compound. Each of the bond wires is connected at one end by means of a first bonding connection to the semiconductor chip and at the other end by means of a second bonding connection to the respective connecting contact. Furthermore, the semiconductor chip has termination surfaces on its surface that are covered by the encapsulating compound and that can be exposed by removing the encapsulating compound. At the exposed termination surfaces it is possible with the aid of measuring needles to tap internal electrical signals from an electrical circuit integrated into the semiconductor chip. By this means it is possible, when an electrical defect occurs in the semiconductor component, to locate a portion of the circuit that is affected by the defect and/or to draw conclusions as to the cause of the defect. Testing a defective semiconductor chip in this manner can be performed in particular for quality assurance purposes in a semiconductor fabrication facility in order to locate and correct defects in the manufacture of the semiconductor component that could later result in the failure of the semiconductor component.

However, the semiconductor component has the disadvantage that the semiconductor chip and/or the bond wires that connect the connecting points of the semiconductor chip to the connection contacts that are accessible from the exterior can be easily damaged when the encapsulating compound is removed and/or when the measuring needles are carelessly positioned, so that the cause of the electrical defect then can only be determined with a great deal of effort or cannot even be determined at all. Another disadvantage is that when the encapsulating compound is being removed, the surface of the semiconductor chip may be exposed, so that the opened semiconductor component then can only be handled with difficulty and/or is no longer protected from environmental exposure. In addition, the electrical contacting of the termination surfaces with needles is difficult to monitor, which is why, if the needles slip, for example, the surface of the chip can easily suffer mechanical damage. Moreover, by removing the encapsulating compound, interference, such as artifacts, can appear in the test signals that are tapped at the termination surface, and it can happen that this interference cannot be distinguished from a signal caused by an electrical defect.

This therefore leads to the object of providing a semiconductor component of the type referred to above in which, in the event of a defect, the termination surface for the test signal can be contacted from the exterior in a simple manner.

This object is accomplished by electrically connecting the termination surface to an analysis contact that projects above the surface of the semiconductor chip, that is located in the interior of the encapsulating compound at a distance from the exterior surface, and that can be exposed by removing areas of the encapsulating compound.

In an advantageous manner the raised analysis contact permits electrical contacting of the termination surface for the test signal by removing an outer layer of the encapsulating compound that is located near the surface, while an inner layer of the encapsulating compound that borders on the semiconductor chip remains intact. Thus, after the analysis contact is exposed, the semiconductor chip continues to be protected from environmental factors and mechanical damage by means of the inner layer. Since the casting compound remains largely intact in the interior area bordering on the semiconductor chip, the removal of the casting compound causes almost no artifacts or other interference in the test signal. The analysis contact may be exposed without wet-chemical etching of the encapsulating compound, for example by removing the material mechanically (e.g. by grinding and/or milling) and/or by removing the encapsulating compound with the aid of a beam of energy, specifically a laser beam. Here it is even possible to remove the encapsulating compound only across a portion of the surface of the semiconductor chip, wherein this portion of the surface may be located at a distance from the edges of the semiconductor chip, so that the analysis contact can also be exposed in the case of a semiconductor component that has electrical connection contacts that are accessible from the exterior on all four sides.

In a preferred embodiment of the invention the analysis contact is connected by means of a first connecting line to a connecting contact that is accessible from the exterior and that borders on the encapsulating compound, and this connecting contact can be connected by means of a second connecting line to an electrical connecting point that is located on the semiconductor chip and that is located at a distance from the termination surface, wherein the connecting lines are arranged in the interior of the encapsulating compound in such a way that the analysis contact can be separated from the first connecting line during or after the removal of areas of the encapsulating compound without interrupting the second connecting line. During normal operation of the semiconductor component a predetermined electrical voltage can be applied at the connecting contact that is accessible from the exterior and thus also on the analysis contact; this voltage may for example be the operating voltage or the ground potential, so that the termination surface for the test signal is then located on a defined potential. This makes it possible for the semiconductor component to operate without malfunctioning. After and/or during the partial removal of the encapsulating compound, the electrical connection between the analysis contact and the connecting contact is interrupted, so that the actual test signal can then be tapped at the analysis contact and/or can be fed into this contact. The connecting lines preferably are designed as bond wires.

In a preferred embodiment of the invention the analysis contact is located transverse to the main plane of extension of the semiconductor chip across a portion of the surface of the semiconductor chip that borders the termination surface. The encapsulating compound may then be removed in order to expose the analysis contact in certain areas at the upper surface of the semiconductor component.

It is advantageous if the analysis contact has at least two bonding points that are stacked above each other transverse to the main plane of extension of the semiconductor chip and if at least one electrical connecting point provided on the surface of the semiconductor chip is connected to a bond wire by means of a single bonding point and/or a quantity of bonding points stacked above one another that is less than the quantity of bonding points of the analysis contact that are stacked above one another. The analysis contact can then be placed in a simple manner on a semiconductor chip when the semiconductor components is fabricated in such a way that the bonding point that is located at the at least one connecting point protrudes. The stacked bonding point is preferably designed as a so-called stacked ball bond.

In a preferred embodiment of the invention the analysis contact extends further beyond the surface of the semiconductor chip that borders the termination surface than all of the other electrically conducting parts that are connected in an electrically conductive manner to the semiconductor chip and that are located in the interior of the encapsulating compound. The at least one analysis contact can then be made accessible for tapping and/or applying the test signal in a simple manner by removing the entire area of a layer of the encapsulating compound located near the surface.

It is advantageous if the semiconductor chip has at least one first edge area and one second edge area that runs transverse and/or parallel thereto, if in the first edge area the semiconductor chip has at least one connecting point that is connected by means of a bond wire embedded in the encapsulating compound to a connecting contact that is accessible from the exterior, and if in the second edge area no connecting point is connected to a connecting contact by means of a bond wire. The at least one analysis contact can then be located in the second edge area or adjacent thereto. In this way the analysis contact can be exposed in an easy manner by removing areas of the encapsulating compound on the side of the semiconductor component on which no bond wires are provided.

In a preferred embodiment of the invention the semiconductor chip can be switched between an operating state and a test state depending on an electrical voltage that is present at the termination surface. Here it is even possible to download analysis data and/or analysis signals from the semiconductor chip in the test state by means of connection contacts that are accessible from the exterior, while in the operating state such downloading is disabled. In this way the semiconductor component can be tested with even greater accuracy for possible errors.

Example embodiments of the invention are explained in greater detail below based on the drawing. The drawing shows:

FIG. 1 A partial side view of a semiconductor component that has a semiconductor chip embedded in an encapsulating compound, wherein the encapsulating compound is shown as being transparent in order to make it possible to see the parts of the semiconductor component that are located in the compound, and wherein only some of the bond wires are illustrated.

Figure 2:
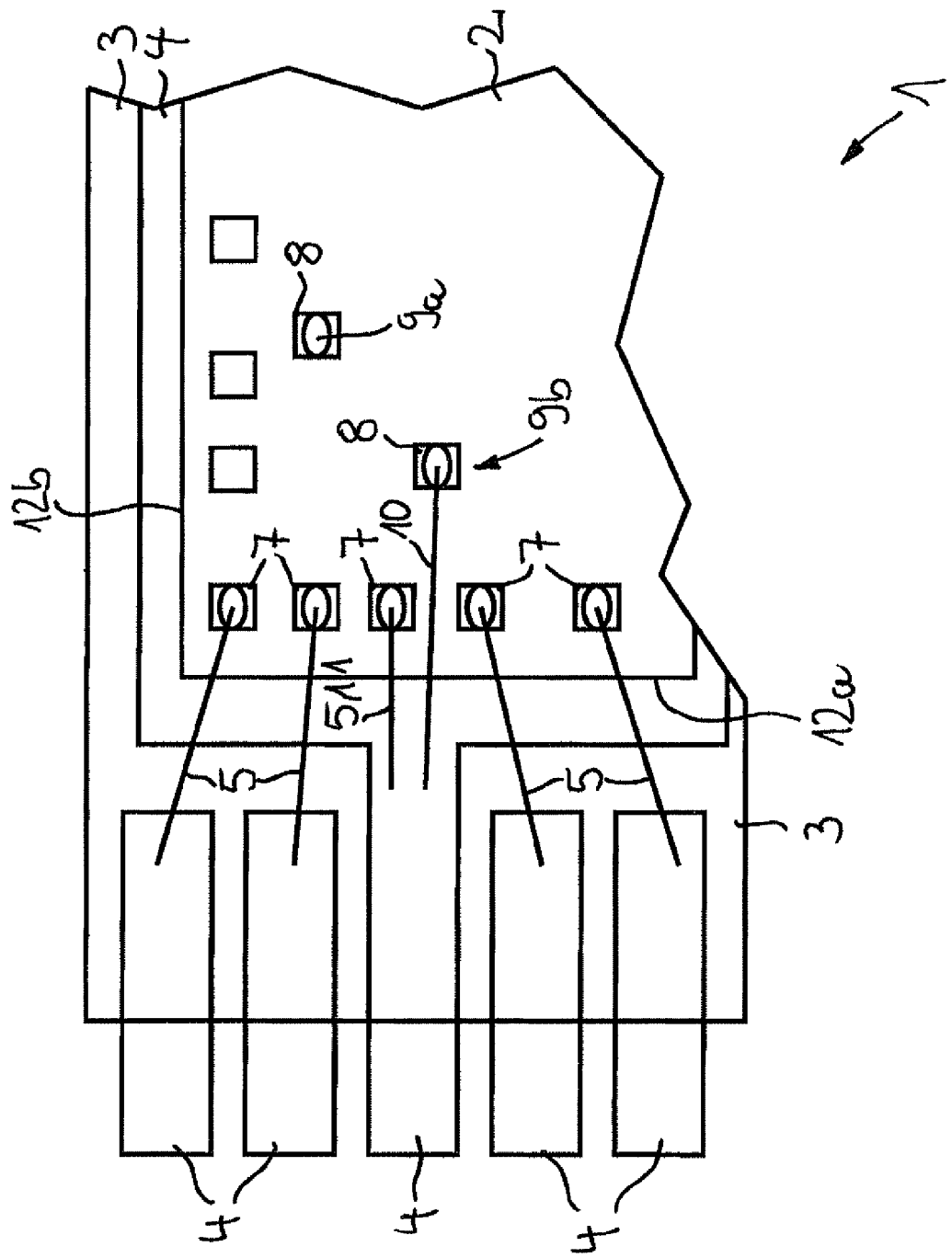
Figure 3:
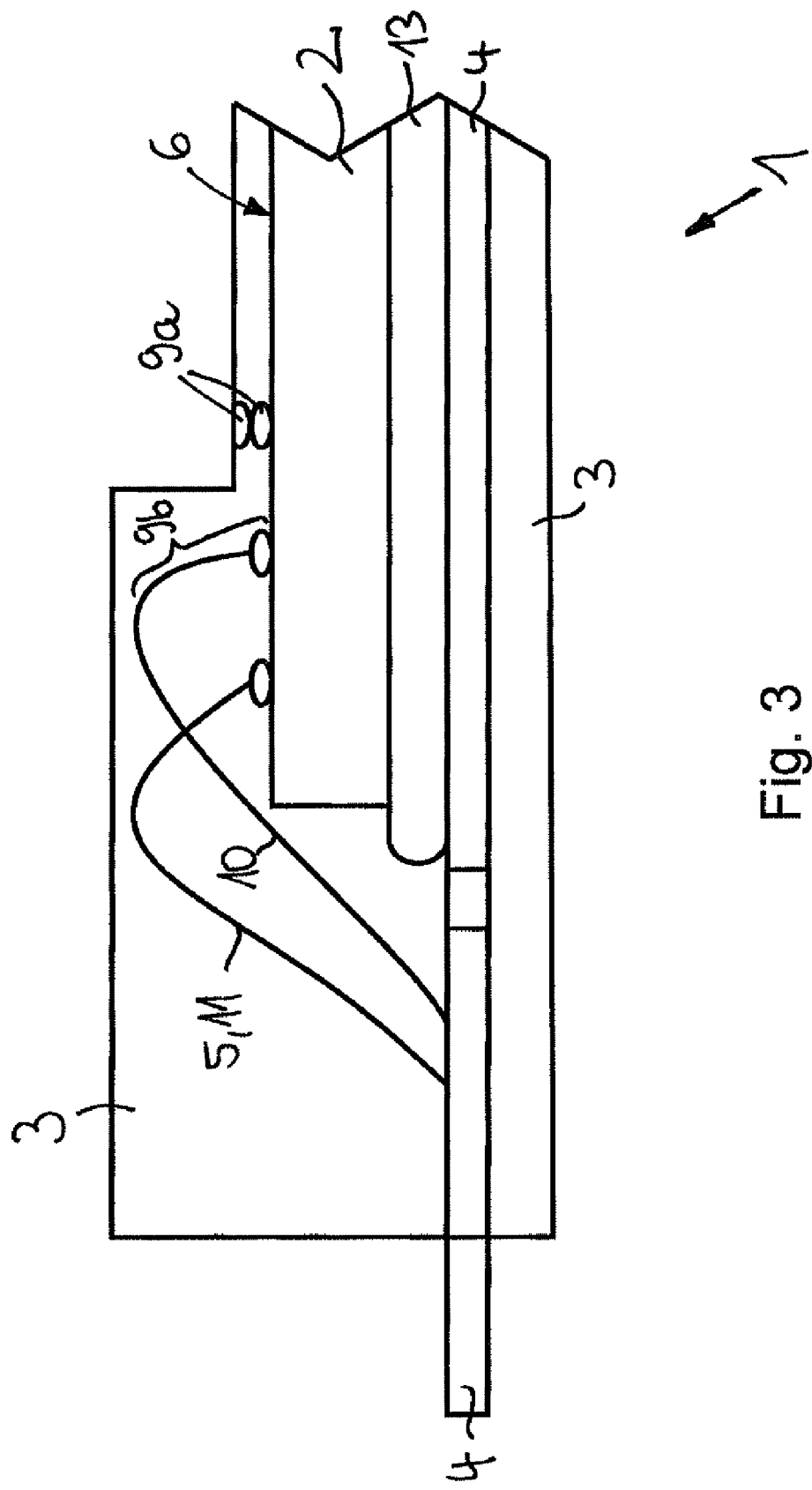
Figure 4:
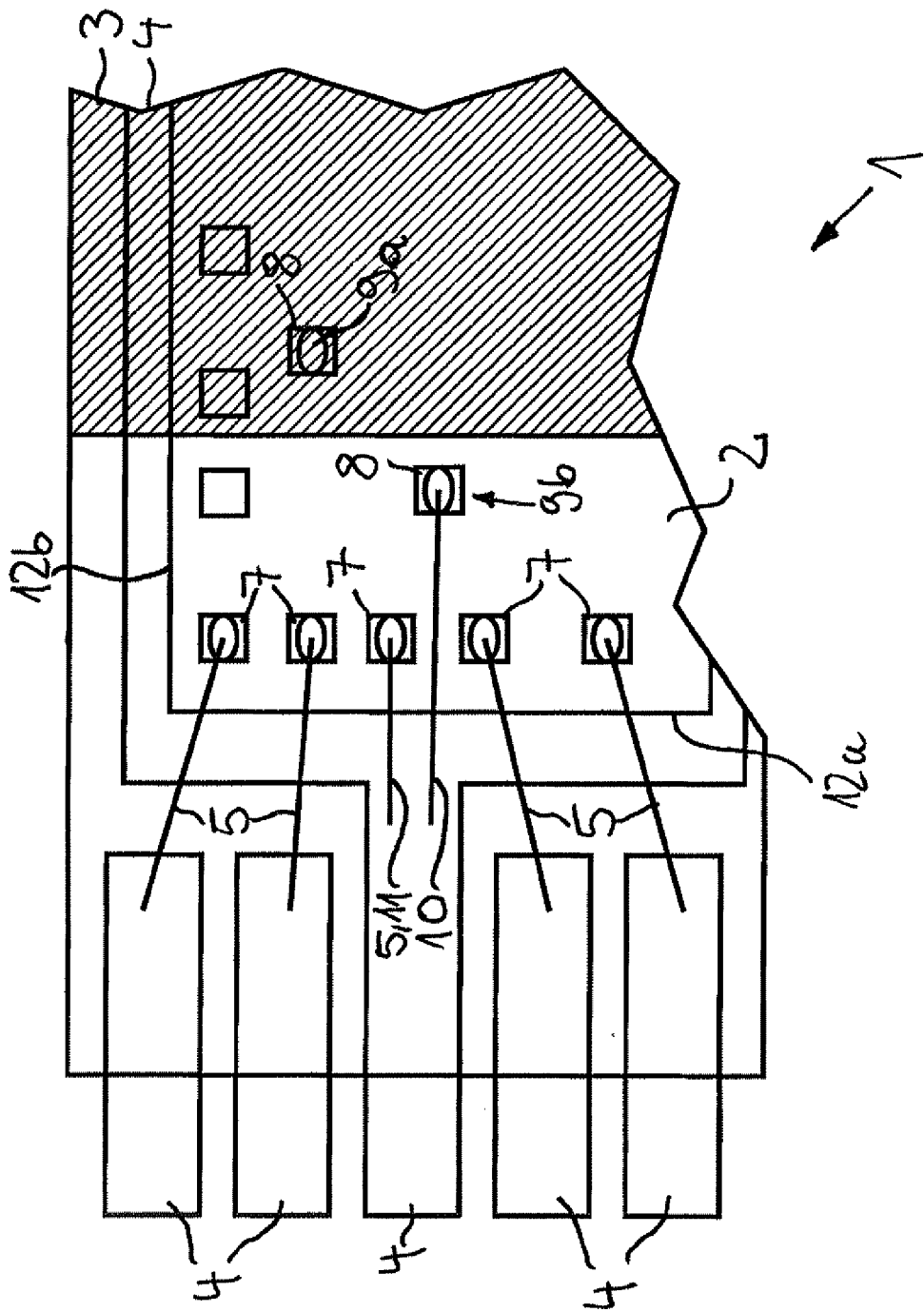
Figure 5:
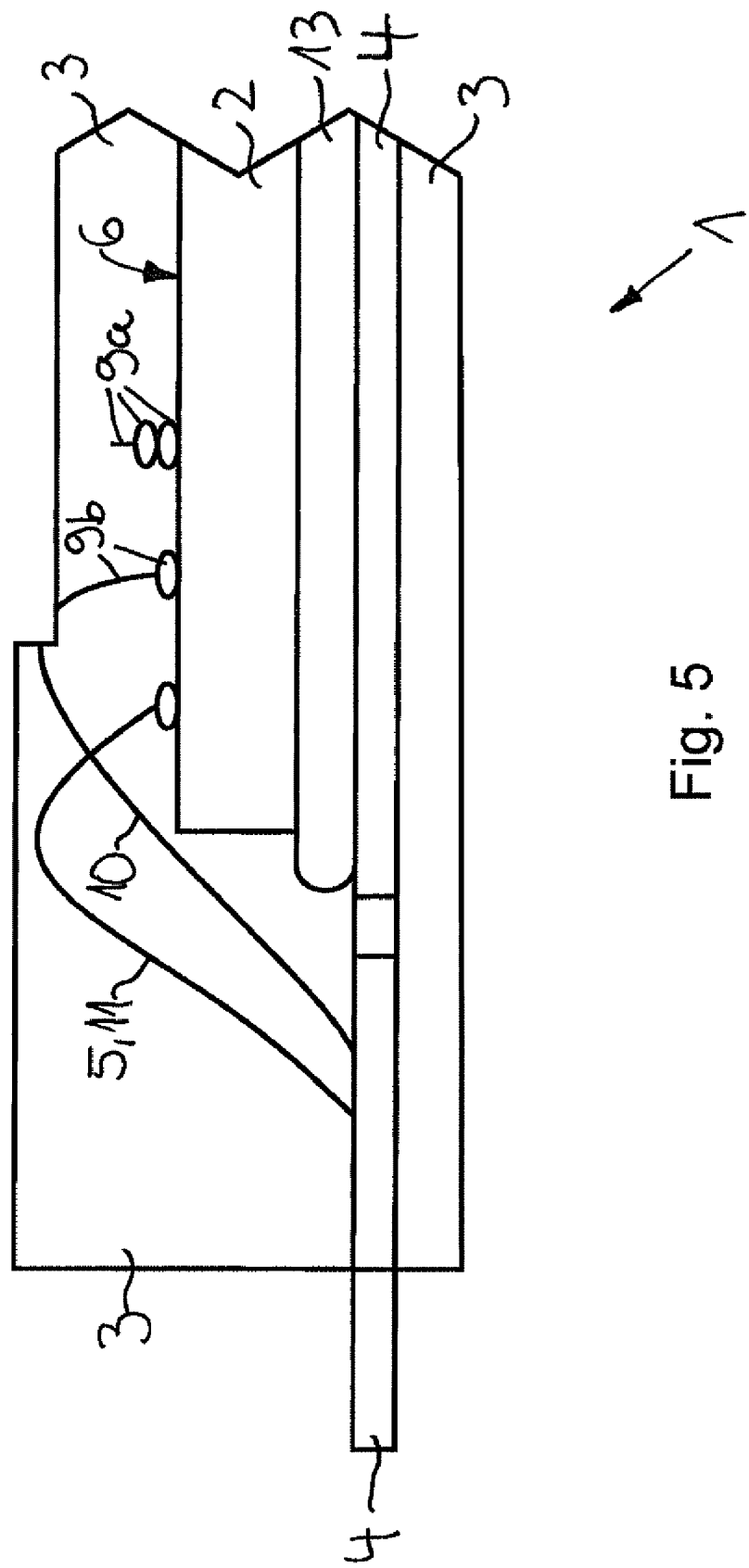
Figure 6:
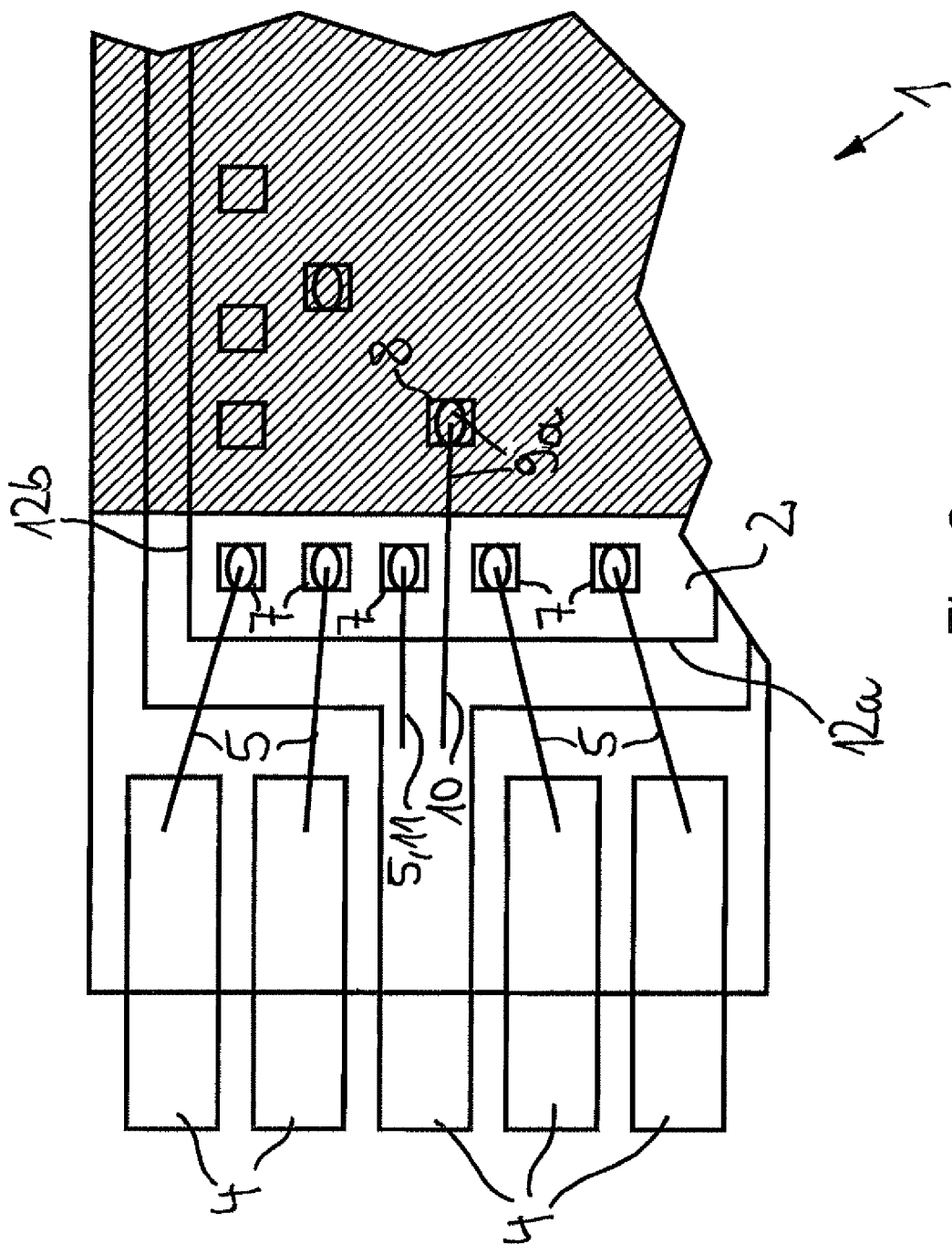
Figure 7:
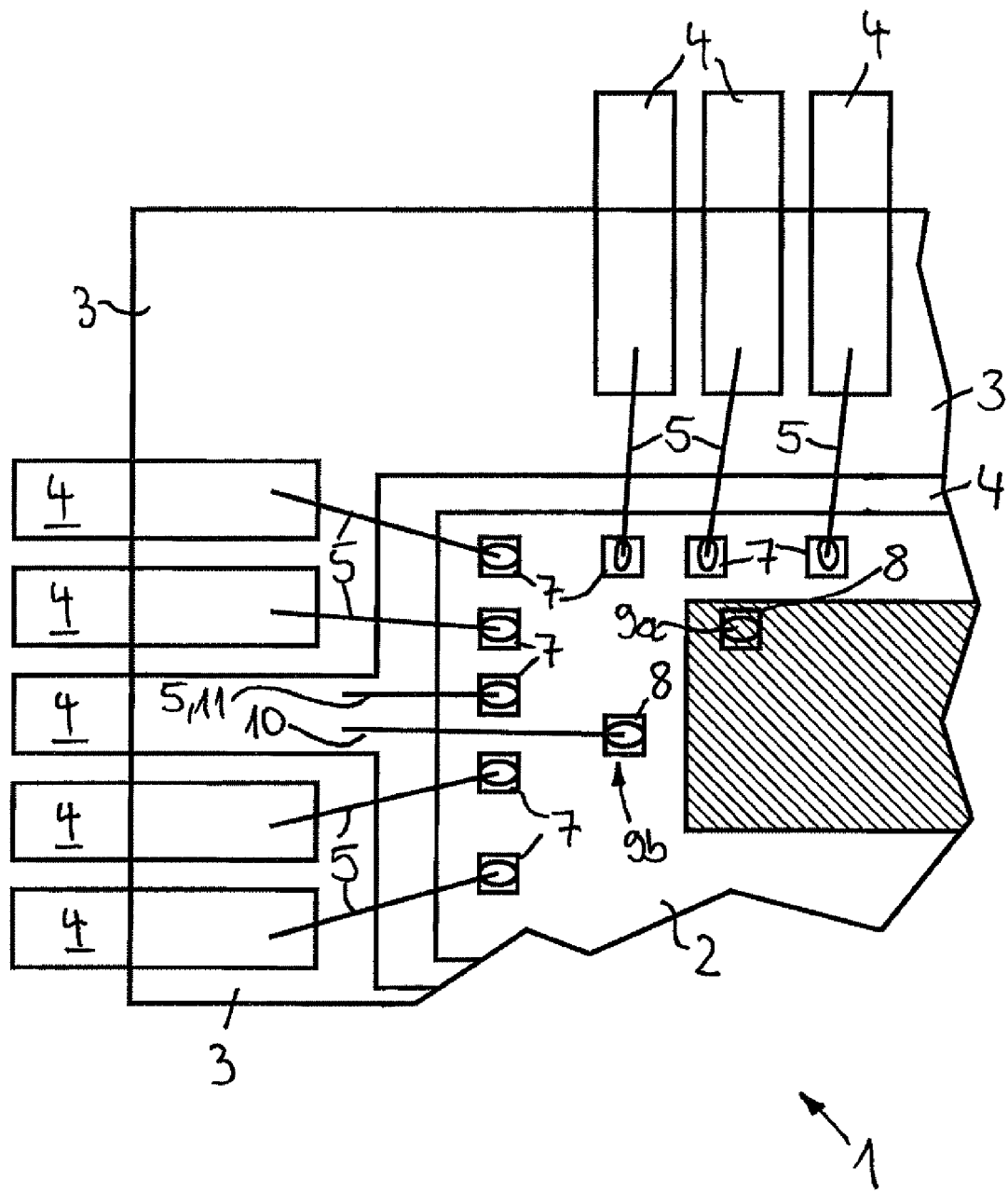
Figure 8:
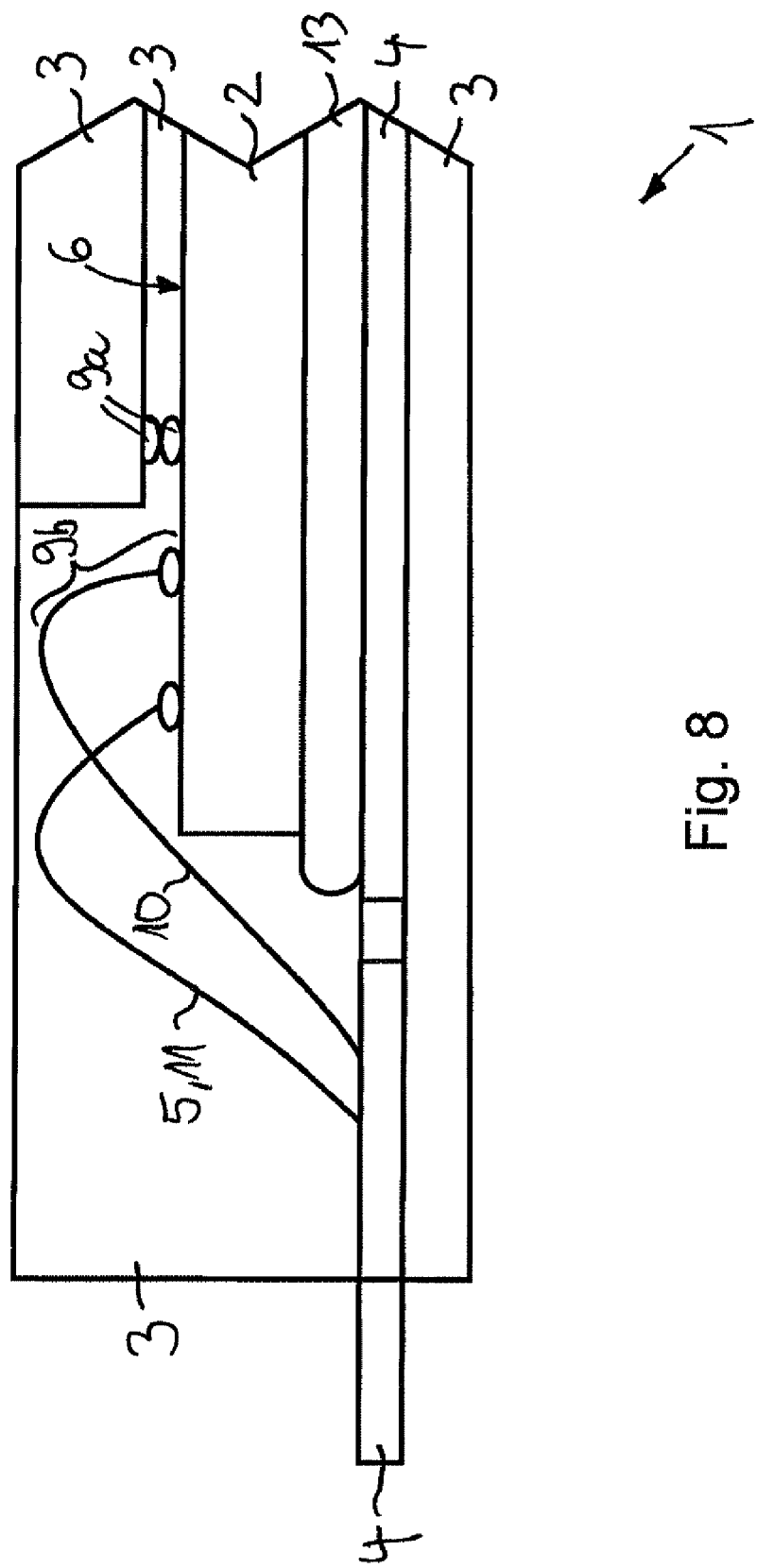
Figure 9:
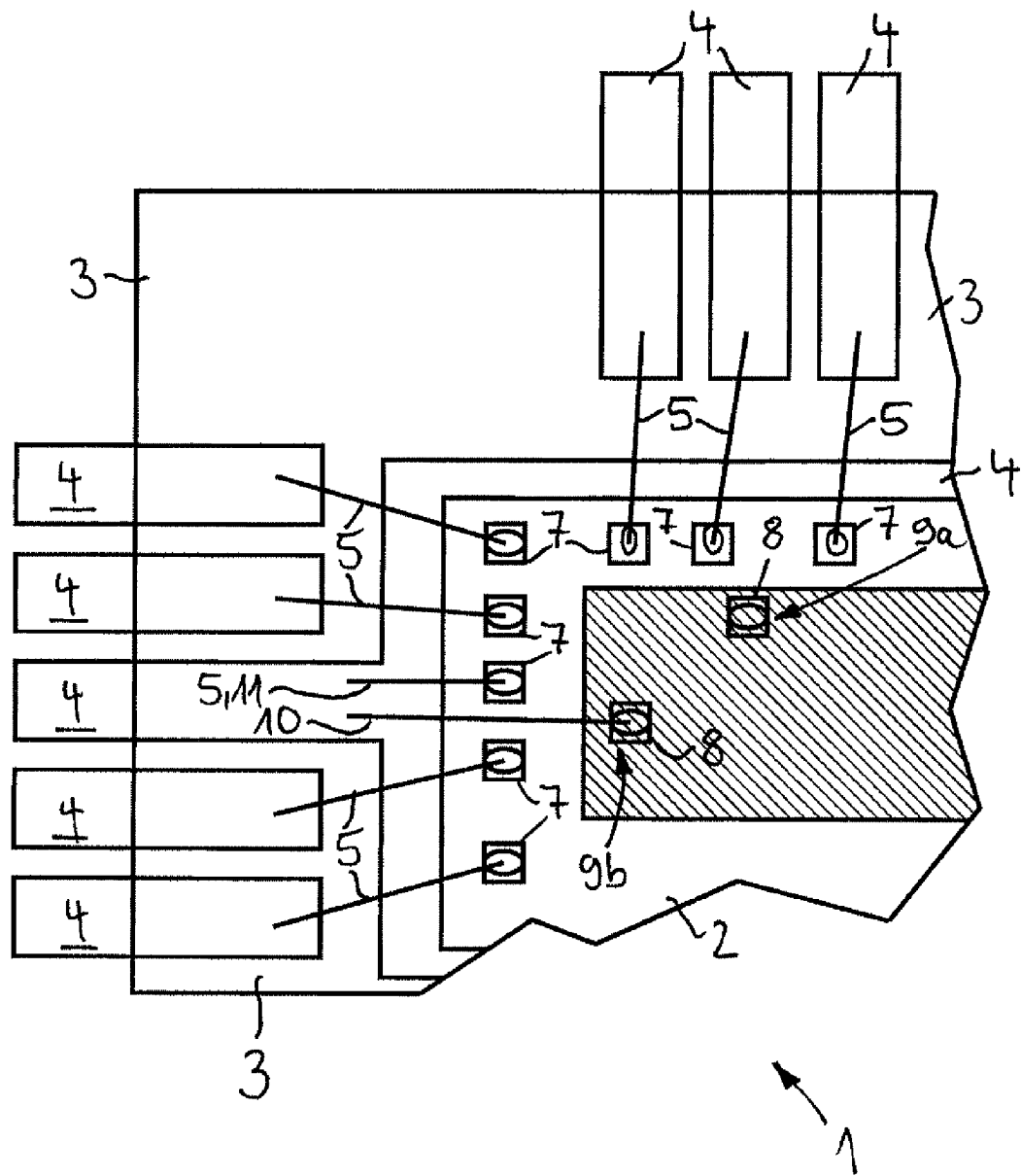

FIG. 2 A partial plan view of the semiconductor component shown in FIG. 1, wherein the encapsulating compound once again is shown as being transparent, FIG. 3 A partial side view of the semiconductor component after the partial removal of the encapsulating compound, wherein only two of the six bond wires are shown, FIG. 4 A partial plan view of the semiconductor component shown in FIG. 3, wherein the area in which the encapsulating compound was partially removed is indicated by hatch lines, FIG. 5 A partial side view of the semiconductor component shown in FIGS. 1 and 2 after the partial removal of the encapsulating compound, wherein only two of the six bond wires are shown, FIG. 6 A partial plan view of the semiconductor component shown in FIG. 5 wherein an area in which the encapsulating compound was partially removed is indicated by hatch lines, and FIG. 7 A partial plan view of the semiconductor component that has connection contacts on a plurality of sides wherein the encapsulating compound is transparent and an area in which the encapsulating compound was removed is indicated by hatch lines, FIG. 8 A partial cross-section through the semiconductor component shown in FIG. 7 wherein the encapsulating compound is shown as being transparent and only two of nine bond wires are shown, FIG. 9 A diagram similar to FIG. 7 wherein the encapsulating compound, however, was partially removed in a different area.

A semiconductor element that is identified by 1 in FIGS. 1 and 2 has a semiconductor chip 2 in which an electrical circuit, which is not shown in the drawing, is integrated. The semiconductor chip 2 is embedded in an electrically insulating encapsulating compound 3 that serves as a housing for the semiconductor chip 2. The encapsulating compound 3 preferably comprises plastic injection-molded around the semiconductor chip 2.

In FIG. 2 it can be seen that the semiconductor component has a plurality of electrical connection contacts 4 that are connected by means of bond wires 5 with connecting points 7 located on the surface 6 of the semiconductor chip 2. The connection contacts 4 each have a first partial area that is injection molded with the encapsulating compound 3, and a second partial area that is exposed and is accessible from the exterior.

The bond wires 5 are each connected at one of their ends by means of a first bonding point to the respective connecting point 7 of the semiconductor chip 2 to which they are associated, and they are connected in an electrically conductive manner by means of a second bonding point to the respective connecting contact 4 to which they are associated. The bond wires 5 run completely in the interior of the casting compound at a distance from the exterior surface of this compound.

The semiconductor chip 2 also has on its surface 6 a plurality of termination surfaces 8 for test signals. An analysis contact 9a, 9b that projects above the surface 6 of the semiconductor chip 2 is located on each of the termination surfaces 8. The projection may be at least 5%, preferably at least 10%, and more preferably at least 25% of the wall thickness possessed by the area of the encapsulating compound 3 that borders the analysis contact 9a, 9b.

The analysis contact 9a, 9b in each case consists of an electrically conductive material, and it is electrically connected to the respective termination surface 8 that is associated with it.

In FIG. 1 it can be seen that the analysis contacts 9a, 9b are located completely within the interior of the encapsulating compound 3 at a distance from the exterior surface of the compound. The analysis contact 9a, 9b can be exposed by removing a layer of the encapsulating compound 3 near the surface. The removal of the encapsulating compound 3 can be done by means of a mechanical tool, by chemical action, and/or with the aid of an energy beam.

In FIG. 3 it can be seen that the removal of material is stopped as soon as a sufficiently large portion of the analysis contact 9a, 9b that is suitable for ensuring that a contact needle of an analysis instrument, which is not shown in the drawing, can make electrical contact is exposed. Then the test signal can be tapped at the termination surface 8 and/or can be fed into this surface via the contact needle and the analysis contact 9a, 9b in order to test the electrical circuit, for example after the occurrence of a defect in the semiconductor component 1. In the area in which the encapsulating compound 3 was removed, a sufficiently thick layer of the encapsulating compound 3, by which means the semiconductor chip 2 continues to remain electrically insulated and protected from mechanical damage and/or environmental exposure, continues to the present.

In FIG. 3 it can be seen that the encapsulating compound 3 is only removed over a partial area of the surface 6 of the semiconductor chip 2. In an adjacent partial area surface 6, above which the bond wires 5 are located, no material removal occurs. This prevents the bond wires from being damaged when the semiconductor component 1 is opened.

The analysis contact 9b is connected by means of a first connecting line 10 to a connecting contact 4 at which a constant electrical potential is present during the normal operation of the semiconductor component 1. The first connecting line 10 is configured as a single part with analysis contact 9b. The connecting contact 4 is connected by means of a second connecting line 11 to an electrical connecting point 7 of the semiconductor chip 2. Thus, during normal operation of the semiconductor component 1 both the connecting point 7 as well as the termination surface 8 are at the constant electrical potential.

In FIGS. 5 and 6 it can be seen that the encapsulating compound 3 can be partially removed from the semiconductor component 1 in such a way that the connection between the analysis contact 9b in the first connecting line 10 is interrupted and the analysis contact 9b is simultaneously exposed. In the process, the second connecting line remains intact. Under the area in which the encapsulating compound 3 was removed, there remains after the completion of the material removal operation a layer of the encapsulating compound 3 that covers the semiconductor chip 2 and protects it from damage. The connecting lines 10, 11 are preferably formed by bond wires.

In FIGS. 1, 3, and 5 it can be seen that the analysis contact 9a is configured as a so-called stacked ball bond, i.e. transverse to the main plane of extension of the semiconductor chip 2 it has two bonding points stacked above one another. It can also be seen that the bond wires 5 are only connected by means of single bonding points to the connecting points 7.

In the example embodiments shown in FIGS. 4 and 6 the semiconductor chip 2 has edge areas 12a, 12b that run transverse to each other. The connecting points 7 that are connected to the bond wires 5 are located in a first edge area 12a; no bond wires 5 are provided in a second edge area 12b. The area in which the encapsulating compound 3 is partially removed is located outside of the first edge area 12. The area in which the encapsulating compound 3 is removed extends without interruption from an outer edge of the encapsulating compound 3 that faces the second edge area 12b to an additional outer edge of the encapsulating compound 3 some distance away.

In the example embodiment shown in FIGS. 7-9 the semiconductor component 1 has connection contacts 4 on a plurality of edge areas that run transverse to each other and that are connected by means of bond wires 5 to connecting points 7 of the semiconductor chip 2. In this example embodiment the material is removed at a distance from the outer edges of the encapsulating compound 3. It should also be noted that a connecting contact 4 is connected by means of a layer of adhesive 13 to the rear side of the semiconductor chip 2 facing away from analysis contacts 9a, 9b.

The invention claimed is:

1. A semiconductor component comprising:
  at least one semiconductor chip in which an electrical circuit is integrated, wherein the semiconductor chip has a top surface extending parallel to a main plane of extension of the semiconductor chip, and has a first termination surface at a first location on said top surface and a second termination surface at a second location on said top surface, said first termination surface constructed to receive a test signal and said second termination surface connected to a connecting point of the semiconductor chip;
  an electrically insulating encapsulating compound that entirely covers the first and the second termination surface, the encapsulating compound having a first exposed surface, spaced a first distance above the top surface, and a second exposed surface spaced a second distance above the top surface and displaced from said second termination surface in a direction parallel to said main extension surface, said second distance being greater than said first distance; and
  an analysis contact electrically connected with the first termination surface, projecting above the first exposed surface of the encapsulating compound, said analysis contact functioning to receive said test signal on said first exposed surface,
  whereby in the event of a defect in said semiconductor chip, said first termination surface for said test signal is contacted on said first exposed surface from a point exterior to said chip while contacts to said second termination surface remain encapsulated in said encapsulating compound below said second exposed surface, wherein the analysis contact is located transverse to the main plane of extension of the semiconductor chip across a portion of a surface of the semiconductor chip that borders the first termination surface.

2. The semiconductor component of claim 1, wherein the analysis contact is connected by means of a first connecting line to a connecting contact that is accessible from an exterior of the encapsulating compound that borders on the encapsulating compound, and this connecting contact is connected by means of a second connecting line to an electrical connecting point that is located on the semiconductor chip and that is located at a distance from the termination surface, and in that the connecting lines are arranged in an interior of the encapsulating compound in such a way that the analysis contact is separated from the first connecting line via the removed areas of the encapsulating compound without interrupting the second connecting line.

3. The semiconductor component of claim 1,
  wherein the analysis contact has a quantity of bonding points that are aligned with and stacked above the first termination surface, transverse to the main plane of extension of the semiconductor chip, and
  wherein at least one electrical connecting point provided on a surface of the semiconductor chip is connected to a bond wire by means of a single bonding point or a quantity of bonding points stacked on the top surface of the semiconductor chip above one another that is less than the quantity of bonding points of the analysis contact.

4. The semiconductor component of claim 1, wherein all other electrically conducting parts that are connected in an electrically conductive manner to the semiconductor chip and that are located in an interior of the encapsulating compound extend a distance above the top surface of the semiconductor chip a distance less than said first distance.

5. The semiconductor component of claim 1, wherein the semiconductor chip has at least one first edge area and one second edge area that runs transverse or parallel thereto, the first edge area of the semiconductor chip having at least one connecting point that is connected by means of a bond wire embedded in the encapsulating compound to a connecting contact that is accessible from an exterior of the encapsulating compound, and the second edge area having no connecting point connected to a connecting contact by means of a bond wire.

6. The semiconductor component of claim 1, wherein the semiconductor chip switches between an operating state and a test state in response to an electrical voltage that is present on at least one of the first and the second termination surface.

7. The semiconductor component of claim 1, further comprising:
   another analysis contact exposed on said second exposed surface and connected to the second termination surface by means of a first connecting line extending through the encapsulating compound;
   a connecting terminal extending from the semiconductor, from a location within the encapsulating compound, to a location exterior to the encapsulating compound; and
   a second connecting line extending from an exposed surface of the encapsulating compound proximal to the another analysis contact to a location on the connecting terminal interior to the encapsulating compound.

8. The semiconductor component of claim 3, further comprising an electrical contact on the top surface of the semiconductor chip, and a bond wire having one end attached to the electrical contact and another end attached to a terminal external to the encapsulating compound.

9. The semiconductor component of claim 2, wherein said first connecting line and said second connecting line each include a respective length of bond wire.

10. The semiconductor component of claim 7, wherein said first connecting line and said second connecting line are formed by:
   attaching a bond wire connected at one end to the another analysis contact, extending along a bond wire arc path to locate a portion of the bond wire more than said second distance above the top surface of the semiconductor chip, and connected at the other end to a location on the connection point;
   encapsulating the semiconductor chip and the entirety of said bond wire, to embed the bond wire extending along the bond wire arc path within the encapsulating compound; and
   removing a portion of the encapsulating compound to form the second exposed surface, said removing cutting through the bond wire at the portion extending more than said second distance above the top surface of the semiconductor chip, and said removing forming a remaining first segment and a remaining second segment of the bond wire, each of the first segment and the second segment embedded in the encapsulating compound, the first remaining segment extending from the second exposed surface to the another analysis contact and to form the first connecting line, and the second remaining segment extending from the second exposed surface to the connection terminal to form the second connection line.

\* \* \* \* \*